United States Patent
Trefonas, III et al.

(10) Patent No.: US 9,437,431 B2
(45) Date of Patent: Sep. 6, 2016

(54) ELECTRONIC DEVICE MANUFACTURE

(75) Inventors: Peter Trefonas, III, Medway, MA (US); Dong Won Chung, Sturbridge, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 487 days.

(21) Appl. No.: 12/069,857

(22) Filed: Feb. 13, 2008

(65) Prior Publication Data

US 2008/0292990 A1    Nov. 27, 2008

Related U.S. Application Data

(60) Provisional application No. 60/901,600, filed on Feb. 13, 2007.

(51) Int. Cl.
*G03F 7/20* (2006.01)
*H01L 21/027* (2006.01)
*G03F 7/40* (2006.01)
*H01L 21/033* (2006.01)
*G03F 7/00* (2006.01)

(52) U.S. Cl.
CPC ............. *H01L 21/0274* (2013.01); *G03F 7/40* (2013.01); *H01L 21/0338* (2013.01); *G03F 7/0035* (2013.01)

(58) Field of Classification Search
CPC .......... G03F 7/20; G03F 7/40; G03F 7/0035; H01L 21/0338; H01L 21/0274
USPC .......................................... 430/311, 322, 330
See application file for complete search history.

(56) References Cited

U.S. PATENT DOCUMENTS

| 6,579,657 B1 * | 6/2003 | Ishibashi et al. ........... 430/270.1 |
| 2005/0164133 A1 * | 7/2005 | Rangarajan et al. .......... 430/322 |
| 2008/0008969 A1 * | 1/2008 | Zhou et al. .................... 430/313 |

* cited by examiner

*Primary Examiner* — Brittany Raymond
(74) *Attorney, Agent, or Firm* — Mintz Levin Cohn Ferris Glovsky and Popeo, P.C.; Peter F. Corless

(57) ABSTRACT

New methods are provided for manufacturing a semiconductor device. Preferred methods of the invention include depositing a photoresist on a semiconductor substrate surface followed by imaging and development of resist coating layer; applying a curable organic or inorganic composition over the resist relief image; etching to provide a relief image of the resist encased by the curable composition; and removing the resist material whereby the curable organic or inorganic composition remains in a relief image of increased pitch relative to the previously developed resist image.

8 Claims, 2 Drawing Sheets

ELECTRONIC DEVICE MANUFACTURE

Figure 1A:
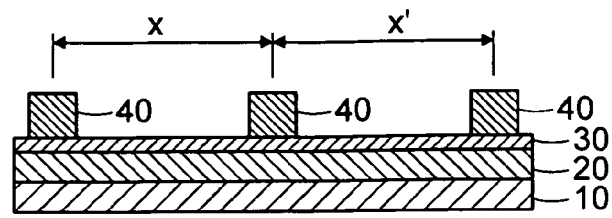

The present invention includes new methods for manufacturing a semiconductor device. Preferred methods of the invention include depositing a photoresist on a semiconductor substrate surface followed by imaging and development of resist coating layer; applying a curable organic or inorganic composition over the resist relief image; etching to provide a relief image of the resist encased by the curable composition; and removing the resist material whereby the curable organic or inorganic composition remains in a relief image of increased pitch relative to the previously developed resist image.

Efforts are constant to reduce sizes of integrated circuits. To achieve such size reductions, the sizes of the constituent features, such as electrical devices and interconnect line widths, that form the integrated circuits are also constantly being decreased. Efforts to reduce feature size is especially prevalent in memory circuits or devices e.g. dynamic random access memories (DRAMs), static random access memories (SRAMs), and ferroelectric (FE) memories. By decreasing the sizes of constituent electrical devices and the conducting lines that access then, the sizes of the memory devices incorporating these features can be decreased. Such size reductions also can enable increasing storage capacities.

Photolithography is commonly used to form features, such as conductive lines, on a substrate. The concept of pitch can be used to describe the size of these features. As referred to herein, pitch is defined as the distance between an identical point in two neighboring features. These features are typically defined by spacings between adjacent features, which are typically filled by a material, such as an insulator. As a result, pitch can be viewed as the sum of the width of a feature and of the width of the space separating that feature from an adjacent or neighboring feature.

Due to factors such as optics and radiation wavelength, however, photolithography techniques can have a minimum pitch below which a particular photolithographic technique cannot reliably form features. This can restrict feature size reduction.

It would be desirable to have new methods to provide electronic device features of decreased dimensions.

We now provide new methods for fabricating a semiconductor device. Methods of the invention can enable production of highly resolved features (e.g. interconnections such as circuits) of reduced dimension.

In one aspect, methods of the invention may comprise:

(i) depositing an imageable material (e.g. photoresist) on a substrate surface (e.g. semiconductor wafer optionally overcoated with an organic and/or inorganic layer(s));

(ii) imaging and developing the imageable material to provide a relief image (e.g. photoresist relief image); and (iii) applying a curable or hardenable organic or inorganic composition over the relief image;

(iv) curing the curable composition such as by flood exposure of activating radiation and/or thermal treatment wherein a hardening reaction of composition component(s) can occur, which hardening may be promoted by acid that migrates from the encased imageable material relief image;

(v) treatment (e.g. etch such as with a gaseous plasma which may include oxygen, and which may include a reactive ion etch, or by development such as by treatment with an aqueous alkaline developer composition) to provide a composite relief image comprising the imageable material encased by organic or inorganic composition;

(vi) removing the imageable material. Preferably, upon such removal, the curable or hardenable organic or inorganic composition remains in a relief image of increased pitch relative to the previously developed imageable material.

In preferred aspects, such methods include only a single exposure to patterned radiation (e.g. 248 nm or 193 nm radiation). In additional preferred aspects, such methods do not include any chemical-mechanical processing (CMP) steps.

In further preferred aspects, the composite (comprising the imageable material encased by organic or inorganic composition) is substantially free of the curable composition on the top surface of the imageable material. As referred to herein, "substantially free" indicates that the top 10 nm of the composite relief image contains than less than 15, 10 or 5 weight percent of the curable organic or inorganic composition (also referred to as herein as the overcoating composition).

In additional preferred aspects, step (v) of the above method comprises exposing the composite to activating radiation to permit hardening of the curable composition and then development to remove the imageable material.

Preferred imageable materials and curable compositions for use in the invention include compositions that contain one or more organic components (e.g. one or more organic resins). Preferred imageable materials and curable compositions may be applied by spin coating.

Preferred imageable compositions are photoresists including those resists that may suitably imaged with 248 nm or 193 nm radiation.

As discussed further below, particularly photoresist including those that contain or more components that can inhibit leaching of photogenerated acid through top coating layers regions, such as a component that has 1) Si substitution, 2) fluorine substitution, 3) is a hyper-branched polymer, and/or is 4) a polymeric particle, as disclosed in U.S. 2006/0246373.

Particularly preferred photoresists for use in accordance with the invention may comprise a diffusable acidic component which has sufficient diffusing length to induce crosslinking (includes any type of hardening) of the overcoated curable composition. An exemplary diffusable acidic component is triflic acid.

Additionally, a separate top coat or barrier layer composition that is positioned over the photoresist may be employed and can serve to restrict upward leaching of acid (such as photogenerated acid). Suitable topcoat compositions and the use thereof are disclosed in U.S. Patent Publication 2006/0105272 to Gallagher et al. Suitable topcoat compositions may contain an organic silicon resin such as disclosed in U.S. Patent Publication 2006/0105272.

Preferred curable compositions (also sometimes referred to herein as overcoating compositions) for use in accordance with the invention may include compositions that comprise a silicon-containing component such as a silicon-containing resin optionally in combination with one or more crosslinkers that can react in the presence of acid. The resin component itself suitably may be reactive (curable) in the presence of acid thereby obviating the need for a separate crosslinker component. In such preferred systems, the curable composition can crosslink or otherwise cure in the presence of acid (including photogenerated acid) that migrates from the imageable material. Preferably, the acid that migrates from the imageable material migrates laterally into the curable composition to induce crosslinking, suitably primarily in a lateral direction. Preferred curable composition may comprise one or more components (e.g. one or more resins) that contain functional groups which serve as crosslinking sites, including for instance silanol sites, hydroxyl alkyl units, hydroxyl phenyl units, epoxy units, anhydride units, lactone units, silicon hydride units, silyl ester units and/or silyl ether units.

A variety of processing steps may be employed to further promote hardening of the curable composition, including e.g. exposure to activating radiation (particularly e.g. a flood exposure) and/or thermal treatment. In preferred methods of the invention, uncured portions of the curable compositions may be removed, such as by treatment with a developer e.g. an alkaline aqueous developer, or by other methods such as by treatment with activating radiation and/or a plasma etchant.

In certain preferred aspects, casting (e.g. spin coating) solvents of the imageable composition and curable composition can have distinct solubility characteristics wherein the casting solvent component of the curable composition does not substantially dissolve or induce intermixing when the curable composition is overcoated onto the imageable material. For instance, in one preferred system, more polar solvents such as one or more alcohols, or an alcohol/water mixture is employed as a casting solvent for the overcoating curable composition.

In other embodiments, semiconductor substrates are provided which may comprise
a relief image of a photoresist composition encased by curable a composition, wherein the top surface of the photoresist composition is substantially free of the curable composition.

Other aspects of the invention are disclosed infra.

FIGS. 1 and 2 each shows schematically preferred processes of the invention.

New methods of fabricating electronic devices are now provided, which may suitably comprise:

(a) providing a photoresist relief image on a substrate;

(b) applying a curable composition over the photoresist relief image to provide a composite of the photoresist and curable composition;

(c) treating the composite to provide relief image of photoresist encased by curable composition;

(d) removing the photoresist while retaining the curable composition.

Referring now to the drawings, FIG. 1 (includes FIGS. 1A through 1E) shows a certain preferred process of the invention.

In FIG. 1A, semiconductor substrate (e.g. wafer) 10 is overcoated with a planarizing layer 20 and then an antireflective layer 30. A photoresist relief image 40 is then provided. The photoresist may be positive-acting or negative-acting, although for many applications a positive-acting photoresist may be preferred.

Figure 1B:
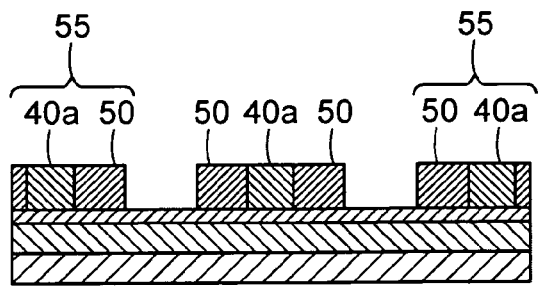

As depicted in FIG. 1B, a further composition 50 is then applied above photoresist 40. Preferably, the composition 50 can harden (e.g. crosslink) in the presence of photogenerated acid that migrates from resist relief image 40. A composite 55 (includes both composition 50 and resist 40) relief image can be provided by development such as treatment with an aqueous alkaline developer solution (e.g. 0.26N tetramethyl ammonium hydroxide aqueous solution). As discussed above, preferred compositions 50 include those contain one or more materials that can exhibit enhanced resistance to a plasma etchant (such as with a gaseous plasma which may include oxygen, and which may include a reactive ion etch) relative to photoresist 40. For instance, preferred compositions 50 include composition that comprise one or more silicon-containing components, such as one or more silicon-containing resins.

FIG. 1B illustrates a preferred aspect of the invention where top surfaces 40a of resist relief image are substantially or completely free of composition 50.

Figure 1C:
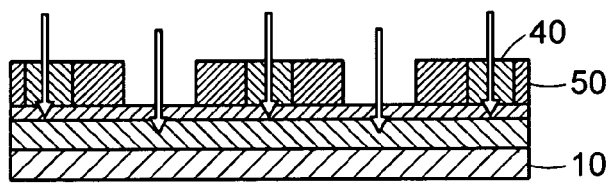
Figure 1D:
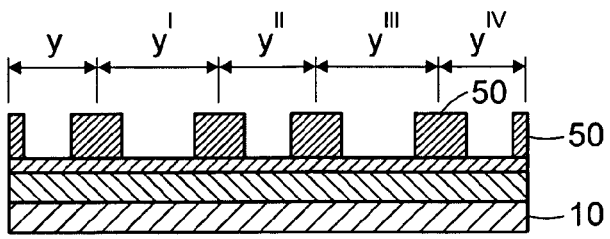

As depicted in FIGS. 1C and 1D photoresist 40 may be removed by treatment with an etchant (such as a gaseous plasma which may include oxygen, and which may include a reactive ion etch) whereby the photoresist 40 is selectively removed while the more etch-resistant composition 50 remains on substrate 10. As can be seen in comparison of FIG. 1A and FIG. 1D, the pitch of the relief image provided in FIG. 1D is significantly increased relative to the pitch of the relief image provided in FIG. 1A, i.e. the distances x, x' shown in FIG. 1A (those distances x and x' defined as the distance between the mid-points of adjacent resist relief images 40) are significantly greater than the distances y, y', y'', y''', and $y^{iv}$, as shown in FIG. 1D (those distances y, y', y'', y''', and $y^{iv}$ defined as the distance between the mid-points of adjacent composition relief images 50). In certain systems, the pitch defined by relief images between the steps of FIG. 1A and FIG. 1D can be increased by at least 50, 75 or 100 percent.

If desired the composition relief image 50 as depicted in FIG. 1D can be further processed as desired including to increase the integrity of the image. For instance, composition 50 can be thermally treated such as at 100° C., 110° C., 120° C. for 1, 2, 3 or 4 minutes.

Figure 1E:
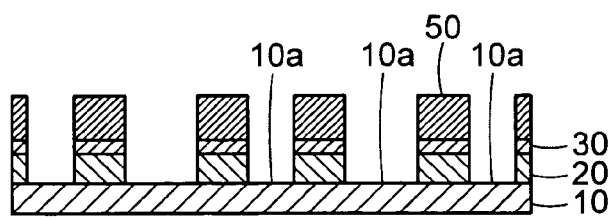

FIG. 1E depicts an optional further processing step where substrates areas 10a are bared of layers 20 and 30 suitably by etching (such as with a gaseous plasma which may include oxygen, and which may include a reactive ion etch). Those bared areas 10a then can be processed as desired including plating and/or further etching.

FIG. 2 (includes FIGS. 2A through 2E) shows a further embodiment of the invention. In FIG. 2, the various reference numbers refer to the same elements and compositions as designated above for FIG. 1.

Thus, as depicted in FIG. 1A, a photoresist relief image 40 is formed above substrate 10. Optional planarizing layer 20 and antireflective layer 30 are interposed between substrate 10 and photoresist relief image 40.

Figure 2A:
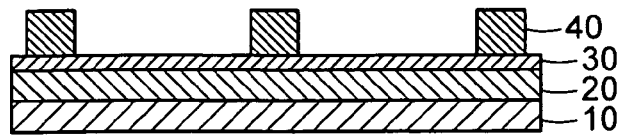
Figure 2B:
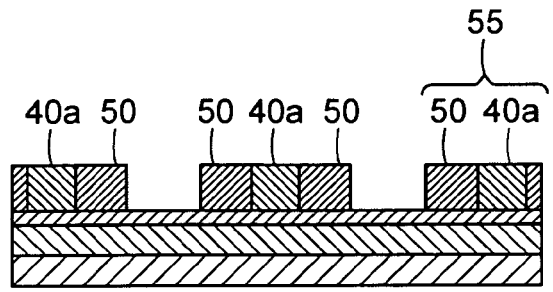
Figure 2C:
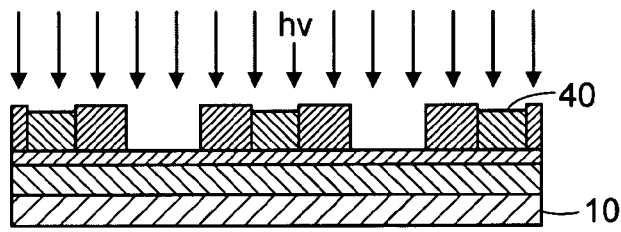
Figure 2D:
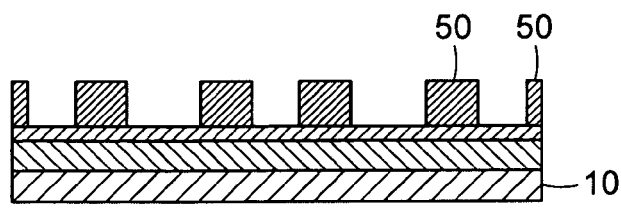
Figure 2E:
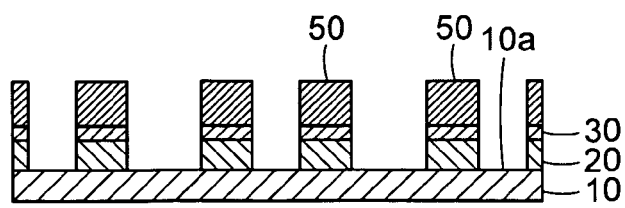

As shown in FIG. 2B, composition 50 is then applied and composite relief image 55 is formed. As shown in FIG. 2C, the composite relief image 55 is exposed (suitably by flood exposure with no photomask employed) to activating radiation (e.g. 248 nm or 193 nm) to harden composition 50. The faster etching photoresist 40 then can be removed via treatment with a suitable etchant (such as with a gaseous plasma which may include oxygen, and which may include a reactive ion etch) to provide the higher pitch relief image 60 of composition 50 as shown in FIG. 2D. The system then may be further processed as desired, such as by etching to bare substrate areas 10a as shown in FIG. 2E.

Exemplary Photoresist Systems

A variety of photoresist compositions can be employed with coating compositions of the invention, including positive-acting and negative-acting photoacid-generating compositions.

As discussed above, particularly preferred photoresists for use in systems of the invention are chemically-amplified resists, particularly positive-acting chemically-amplified resist compositions, where the photoactivated acid in the resist layer induces a deprotection-type reaction of one or more composition components to thereby provide solubility differentials between exposed and unexposed regions of the resist coating layer. A number of chemically-amplified resist compositions have been described, e.g., in U.S. Pat. Nos. 4,968,581; 4,883,740; 4,810,613; 4,491,628 and 5,492,793.

Coating compositions of the invention are particularly suitably used with positive chemically-amplified photoresists that have acetal groups that undergo deblocking in the presence of a photoacid. Such acetal-based resists have been described in e.g. U.S. Pat. Nos. 5,929,176 and 6,090,526.

Preferred positive-acting photoresists for use with an underlying coating composition of the invention contains an imaging-effective amount of photoacid generator compounds and one or more resins that are selected from the group of:

1) a phenolic resin that contains acid-labile groups that can provide a chemically amplified positive resist particularly suitable for imaging at 248 nm. Particularly preferred resins of this class include: i) polymers that contain polymerized units of a vinyl phenol and an alkyl acrylate, where the polymerized alkyl acrylate units can undergo a deblocking reaction in the presence of photoacid. Exemplary alkyl acrylates that can undergo a photoacid-induced deblocking reaction include e.g. t-butyl acrylate, t-butyl methacrylate, methyladamantyl acrylate, methyl adamantyl methacrylate, and other non-cyclic alkyl and alicyclic acrylates that can undergo a photoacid-induced reaction, such as polymers in U.S. Pat. Nos. 6,042,997 and 5,492,793; ii) polymers that contain polymerized units of a vinyl phenol, an optionally substituted vinyl phenyl (e.g. styrene) that does not contain a hydroxy or carboxy ring substituent, and an alkyl acrylate such as those deblocking groups described with polymers i) above, such as polymers described in U.S. Pat. No. 6,042, 997; and iii) polymers that contain repeat units that comprise an acetal or ketal moiety that will react with photoacid, and optionally aromatic repeat units such as phenyl or phenolic groups; such polymers have been described in U.S. Pat. Nos. 5,929,176 and 6,090,526.

2) a resin that is substantially or completely free of phenyl or other aromatic groups that can provide a chemically amplified positive resist particularly suitable for imaging at sub-200 nm wavelengths such as 193 nm. Particularly preferred resins of this class include: i) polymers that contain polymerized units of a non-aromatic cyclic olefin (endocyclic double bond) such as an optionally substituted norbornene, such as polymers described in U.S. Pat. Nos. 5,843,624, and 6,048,664; ii) polymers that contain alkyl acrylate units such as e.g. t-butyl acrylate, t-butyl methacrylate, methyladamantyl acrylate, methyl adamantyl methacrylate, and other non-cyclic alkyl and alicyclic acrylates; such polymers have been described in U.S. Pat. No. 6,057, 083; European Published Applications EP01008913A1 and EP00930542A1; and U.S. Pat. No. 6,136,501; and iii) polymers that contain polymerized anhydride units, particularly polymerized maleic anhydride and/or itaconic anhydride units, such as disclosed in European Published Application EP01008913A1 and U.S. Pat. No. 6,048,662.

3) a resin that contains repeat units that contain a hetero atom, particularly oxygen and/or sulfur (but other than an anhydride, i.e. the unit does not contain a keto ring atom), and preferable are substantially or completely free of any aromatic units. Preferably, the heteroalicyclic unit is fused to the resin backbone, and further preferred is where the resin comprises a fused carbon alicyclic unit such as provided by polymerization of a norborene group and/or an anhydride unit such as provided by polymerization of a maleic anhydride or itaconic anhydride. Such resins are disclosed in PCT/US01/14914.

4) a resin that contains fluorine substitution (fluoropolymer), e.g. as may be provided by polymerization of tetrafluoroethylene, a fluorinated aromatic group such as fluorostylene compound, and the like. Examples of such resins are disclosed e.g. in PCT/US99/21912.

Suitable photoacid generators to employ in a positive or negative acting photoresist overcoated over a coating composition of the invention include imidosulfonates such as compounds of the following formula:

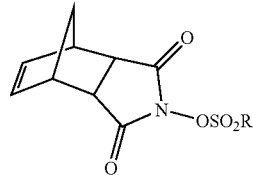

wherein R is camphor, adamantane, alkyl (e.g. $C_{1-12}$ alkyl) and perfluoroalkyl such as perfluoro($C_{1-12}$alkyl), particularly perfluorooctanesulfonate, perfluorononanesulfonate and the like. A specifically preferred PAG is N-[(perfluorooctanesulfonyl)oxy]-5-norbornene-2,3-dicarboximide.

Sulfonate compounds are also suitable PAGs for resists overcoated a coating composition of the invention, particularly sulfonate salts. Two suitable agents for 193 mm and 248 nm imaging are the following PAGS 1 and 2:

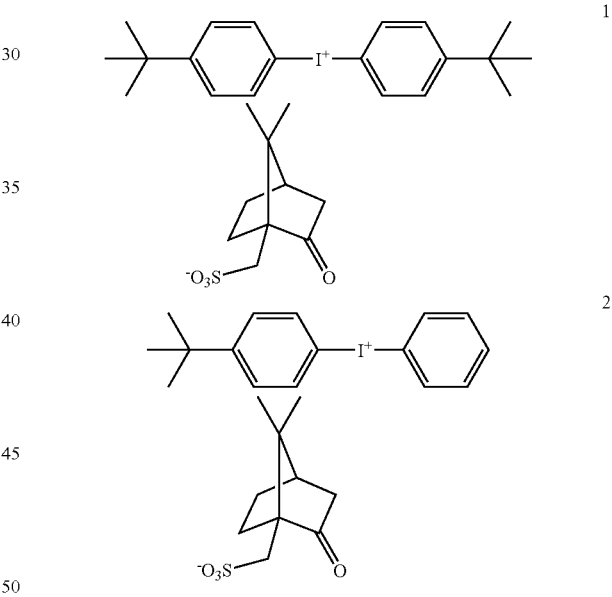

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3$— where R is adamantane, alkyl (e.g. $C_{1-12}$ alkyl) and perfluoroalkyl such as perfluoro ($C_{1-12}$alkyl), particularly perfluorooctanesulfonate, perfluorobutanesulfonate and the like.

Other known PAGS also may be employed in photoresist used with underlaying coating compositions.

A preferred optional additive of photoresists overcoated a coating composition of the invention is an added base, particularly tetrabutylammonium hydroxide (TBAH), or tetrabutylammonium lactate, which can enhance resolution of a developed resist relief image. For resists imaged at 193 nm, a preferred added base is a hindered amine such as diazabicyclo undecene or diazabicyclononene. The added base is suitably used in relatively small amounts, e.g. about 0.03 to 5 percent by weight relative to the total solids.

Preferred negative-acting resist compositions for use with an overcoated coating composition of the invention comprise a mixture of materials that will cure, crosslink or harden upon exposure to acid, and a photoacid generator.

Particularly preferred negative-acting resist compositions comprise a resin binder such as a phenolic resin, a cross-linker component and a photoactive component of the invention. Such compositions and the use thereof have been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycolurils, benzoguanamine-based materials and urea-based materials. Melamine-formaldehyde resins are generally most preferred. Such crosslinkers are commercially available, e.g. the melamine resins sold by Cytec Industries under the trade names Cymel 300, 301 and 303. Glycoluril resins are sold by Cytec Industries under trade names Cymel 1170, 1171, 1172, Powderlink 1174, and benzoguanamine resins are sold under the trade names of Cymel 1123 and 1125.

As discussed above, particularly preferred photoresists for use in accordance with the invention include those resists that contain or more components that can inhibit leaching of photogenerated acid through top coating layers regions, such as a component that has 1) Si substitution, 2) fluorine substitution, 3) is a hyper-branched polymer, and/or is 4) a polymeric particle. Such photoresists are disclosed in U.S. 2006/0246373.

In particular, such preferred photoresists may contain one or more substantially non-mixable materials as described in U.S. 2006/0246373 including Si-containing materials. Especially preferred substantially non-mixable materials include nanostructured compositions, which are commercially available from groups such as Hybrid Plastics (Fountain Valley, Calif.), Sigma/Aldrich, and others. Such materials may include molecular silicas which have a Si—O core enveloped by organic groups; silanols; and polymers and resins which include silsesquioxane cage-structured compounds and may be silicones, styrenics, acrylics, alicyclics such as norbornenes and others.

Particles (including organic particles) useful as substantially non-mixable materials include Si-containing and fluorinated materials. Such particles are commercially available, or can be readily synthesized, e.g. by reaction of one or more monomers together with a crosslinking agent and an initiator compound if desired. The reacted monomers may have substitution as desired e.g. fluorine, Si groups, photoacid-labile groups such as photoacid-labile esters or acetals, other base-solubilizing groups such as alcohols and the like. See Example 1 which follows for an exemplary synthesis of such particles produced with multiple distinct monomers, where one of the monomers provides a photoacid-labile group to the resulting polymer particle.

Overcoating (Curable) Compositions:

As discussed above, preferred overcoating or curable compositions may comprise an organic polysilica material, suitably with solubility in polar solvents such as alcohols including e.g. isopropanol, isobutanol, isopentanol, 2-methy,-1-butanol, 3-methyl-2-pentanol and ethanol, or an alcohol-water mixture.

One suitable class of silicon-containing resin for use in overcoating compositions in accordance with the invention are acrylate copolymers (includes terpolymers, tetrapolymers and other higher order polymers. For example, one suitable resin is the reaction product of acrylic acid or methacrylic acid and a silane-containing monomer such as 3-m,ethacryloxypropyltrimethoxysilane. Such resins are suitably use din combination with a separate (not covalently linked to resin) crosslinking agent such as amine-containing materials e.g. a glycouril such as tetramethoxyglycouril or a benzaguanamine.

Additional suitable organic polysilica resins may be suitably prepared using a partial condensate of one or more organosilanes and one or more silicon-containing cross-linking agents, wherein the cross-linking agent contains >4 hydrolyzable groups. Particularly suitable silicon-containing cross-linking agents have 5 or 6 hydrolyzable groups. As used herein, the term "partial condensate" refers to a silane oligomer or prepolymer or hydrolyzate that is capable of undergoing further condensation reactions to increase its molecular weight.

Such organic polysilica partial condensates may be suitably prepared methods that include the steps of: a) reacting a mixture including one or more silanes of formula (I) $R_aSiY_{4-a}$ and one or more silanes of formula (II) $R^1_b(R^2O)_{3-b}Si(R^3)_cSi(OR^4)_{3-d}R^5_d$ in the presence of a basic catalyst; and b) reacting the mixture in the presence of an acidic catalyst; wherein R is hydrogen, $(C_1-C_8)$alkyl, $(C_7-C_{12})$arylalkyl, substituted $(C_7-C_{12})$arylalkyl, aryl, and substituted aryl; Y is any hydrolyzable group; a is an integer of 1 to 2; $R^1$, $R^2$, $R^4$ and $R^5$ are independently selected from hydrogen, $(C_1-C_6)$alkyl, $(C_7-C_{12})$arylalkyl, substituted $(C_7-C_{12})$aryl-alkyl, aryl, and substituted aryl; $R^3$ is $(C_1-C_{10})$alkyl, —$(CH_2)_h$—, —$(CH_2)_{h1}$-$E_k$-$(CH_2)_{h2}$—, —$(CH_2)_h$-Z, arylene, substituted arylene, or arylene ether; E is oxygen, $NR^6$ or Z; Z is aryl or substituted aryl; $R^6$ is hydrogen, $(C_1-C_6)$alkyl, aryl or substituted aryl; b and d are each an integer of 0 to 2; c is an integer of 0 to 6; and h, h1, h2 and k are independently an integer from 1 to 6; provided that at least one of R, $R^1$, $R^3$ and $R^5$ is not hydrogen.

In one embodiment, R is $(C_1-C_4)$alkyl, benzyl, hydroxybenzyl, phenethyl or phenyl, and more preferably methyl, ethyl, iso-butyl, tert-butyl or phenyl. Suitable hydrolyzable groups for Y include, but are not limited to, halo, $(C_1-C_6)$ alkoxy, acyloxy and the like, and preferably chloro and $(C_1-C_2)$alkoxy. Suitable organosilanes of formula (I) include, but are not limited to, methyl trimethoxysilane, methyl triethoxysilane, phenyl trimethoxysilane, phenyl triethoxysilane, tolyl trimethoxysilane, tolyl triethoxysilane, propyl tripropoxysilane, iso-propyl triethoxysilane, iso-propyl tripropoxysilane, ethyl trimethoxysilane, ethyl triethoxysilane, iso-butyl triethoxysilane, iso-butyl trimethoxysilane, tert-butyl triethoxysilane, tert-butyl trimethoxysilane, cyclohexyl trimethoxysilane, cyclohexyl triethoxysilane, benzyl trimethoxysilane, benzyl triethoxysilane, phenethyl trimethoxysilane, hydroxybenzyl trimethoxysilane, hydroxyphenylethyl trimethoxysilane and hydroxyphenylethyl triethoxysilane.

Organosilanes of formula (II) preferably include those wherein $R^1$ and $R^5$ are independently $(C_1-C_4)$alkyl, benzyl, hydroxybenzyl, phenethyl or phenyl. Preferably $R^1$ and $R^5$ are methyl, ethyl, tert-butyl, iso-butyl and phenyl. In one embodiment, $R^3$ is $(C_1-C_{10})$alkyl, —$(CH_2)_h$—, arylene, arylene ether and —$(CH_2)_{h1}$-E-$(CH_2)_{h2}$. Suitable compounds of formula (II) include, but are not limited to, those wherein $R^3$ is methylene, ethylene, propylene, butylene, hexylene, norbornylene, cycloheylene, phenylene, phenylene ether, naphthylene and —$CH_2$—$C_6H_4$—$CH_2$—. In a further embodiment, c is 1 to 4.

Suitable organosilanes of formula (I) include, but are not limited to, bis(trimethoxysilyl)methane, bis(triethoxysilyl) methane, bis(triphenoxysilyl)methane, bis(dimethoxymethylsilyl)methane, bis(diethoxymethyl-silyl)methane, bis(dimethoxyphenylsilyl)methane, bis(diethoxyphenylsilyl) methane, bis(methoxydimethylsilyl)methane, bis (ethoxydimethylsilyl)methane, bis(methoxydiphenylsilyl) methane, bis(ethoxydiphenylsilyl)methane, bis (trimethoxysilyl)ethane, bis(triethoxysilyl)ethane, bis (triphenoxysilyl)ethane, bis(dimethoxymethylsilyl)ethane, bis(diethoxymethylsilyl)ethane, bis(dimethoxyphenylsilyl) ethane, bis(diethoxyphenylsilyl)ethane, bis(methoxydimethylsilyl)ethane, bis(ethoxydimethylsilyl)ethane, bis (methoxy-diphenylsilyl)ethane, bis(ethoxydiphenylsilyl) ethane, 1,3-bis(trimethoxysilyl))propane, 1,3-bis (triethoxysilyl)propane, 1,3-bis(triphenoxysilyl)propane, 1,3-bis(dimethoxy-methylsilyl)propane, 1,3-bis(diethoxymethylsilyl)propane, 1,3-bis(dimethoxyphenyl-silyl)propane, 1,3-bis(diethoxyphenylsilyl)propane, 1,3-bis(methoxydimethylsilyl)propane, 1,3-bis(ethoxydimethylsilyl)propane, 1,3-bis(methoxydiphenylsilyl)propane, and 1,3-bis(ethoxydiphenylsilyl)propane.

Suitable organic polysilica materials include, but are not limited to, silsesquioxanes, partially condensed halosilanes or alkoxysilanes such as partially condensed by controlled hydrolysis tetraethoxysilane having number average molecular weight of 500 to 20,000, organically modified silicates having the composition $RSiO_3$, $O_3SiRSiO_3$, $R_2SiO_2$ and $O_2SiR_3SiO_2$ wherein R is an organic substituent, and partially condensed orthosilicates having $Si(OR)_4$ as the monomer unit. Silsesquioxanes are polymeric silicate materials of the type $RSiO_{1.5}$ where R is an organic substituent. Suitable silsesquioxanes are alkyl silsesquioxanes; aryl silsesquioxanes; alkyl/aryl silsesquioxane mixtures; and mixtures of alkyl silsesquioxanes. Silsesquioxane materials include homopolymers of silsesquioxanes, copolymers of silsesquioxanes or mixtures thereof. Such materials are generally commercially available or may be prepared by known methods.

In an alternate embodiment, the organic polysilica materials may contain a wide variety of other monomers in addition to the silicon-containing monomers described above. For example, the organic polysilica materials may further comprise a second cross-linking agent, and carbosilane moieties.

The overcoating composition also may contain a separate (not covalently linked to primary resin) crosslinking agent. For use with a composition that comprises a silicon resin, suitable cross-linking agents may be any known cross-linkers for silicon-containing materials. Typical cross-linking agents include silanes of formula (III) $M''(OR^{11})_n$ wherein M is aluminum, titanium, zirconium, hafnium, silicon, magnesium, or boron; $R^{11}$ is ($C_1$-$C_6$)alkyl, acyl, or $Si(OR^{12})_3$; $R^{12}$ is ($C_1$-$C_6$)alkyl or acyl; and n is the valence of M. In one embodiment, $R^{11}$ is methyl, ethyl, propyl or butyl. In another embodiment, M is aluminum, titanium, zirconium, hafnium or silicon. It will be appreciated by those skilled in the art that a combination of such second cross-linkers may be used. The ratio of the mixture of silanes of formulae (I) and (II) to such cross-linking agents of organosilanes is typically from 99:1 to 1:99, preferably from 95:5 to 5:95, more preferably from 90:10 to 10:90.

Carbosilane moieties refer to moieties having a $(Si—C)_x$ structure, such as $(Si-A)_x$, structures wherein A is a substituted or unsubstituted alkylene or arylene, such as $SiR_3CH_2$—, —$SiR_2CH_2$—, =$SiRCH_2$—, and =$SiCH_2$—, where R is usually hydrogen but may be any organic or inorganic radical. Suitable inorganic radicals include organosilicon, siloxyl, or silanyl moieties. These carbosilane moieties are typically connected "head-to-tail", i.e. having Si—C—Si bonds, in such a manner that a complex, branched structure results. Particularly useful carbosilane moieties are those having the repeat units ($SiH_xCH_2$) and ($SiH_{y-1}(CH=CH_2)CH_2$), where x=0 to 3 and y=1 to 3. These repeat units may be present in the organic polysilica resins in any number from 1 to 100,000, and preferably from 1 to 10,000. Suitable carbosilane precursors are those disclosed in U.S. Pat. No. 5,153,295 (Whitmarsh et al.) and U.S. Pat. No. 6,395,649 (Wu).

The organic polysilica partial condensates may be prepared by reacting one or more tri- or di-functional organo silanes such as those of formula I, one or more silicon-containing cross-linking agents such as those of formula II, and typically water, for a period of time sufficient to hydrolyze (or partially condense) the silanes to form a partial condensate having the desired weight average molecular weight. Typically, the reaction temperature is 78-80° C. due to the boiling point of ethanol. The amount of water is typically from 0.1 to 2.0 mole equivalents, more typically from 0.25 to 1.75 mole equivalents, and even more typically from 0.75 to 1.5 mole equivalents. An acidic or basic catalyst is typically used. Suitable acids and bases include strong acids and strong bases such as hydrochloric acid and tetramethylammonium hydroxide respectively weak acids and bases such as acetic acid or triethyl amine respectively. Typically strong acid catalyst like hydrochloric acid is used to catalyze the hydrolysis and condensation reaction of the silanes. The silanes and water are typically reacted from 0.5 to 48 hours, although longer or shorter times may be used. Particularly suitable reaction times are from 1 to 24 hours. The mole ratios of the silanes may vary over a wide range. The mole ratio of the one or more silanes of formula (I) to the one or more silanes of formula (II) is from 99:1 to 1:99, particularly from 95:5 to 5:95, more particularly from 90:10 to 10:90, and still more particularly from 80:20 to 20:80.

Suitable organic polysilica partial condensates for use in overcoating compositions may have a wide range of molecular weights. Typically, the partial condensates have a weight average molecular weight of ≤20,000, although higher molecular weights may be used. More typically, the weight average molecular weight is ≤15,000, still more typically ≤10,000, and most typically ≤5,000.

Following formation of the organic polysilica partial condensates, and after optionally removing the acidic catalyst, a stabilizing agent may be optionally added to the partial condensates. Such stabilizing agents are preferably organic acids. Any organic acid having at least 2 carbons and having an acid dissociation constant ("pKa") of about 1 to about 4 at 25° C. is suitable. Preferred organic acids have a pKa of about 1.1 to about 3.9, and more preferably about 1.2 to about 3.5. Organic acids capable of functioning as chelating agents are preferred. Such chelating organic acids include polycarboxylic acids such as di-, tri-, tetra- and higher carboxylic acids, and carboxylic acids substituted with one or more of hydroxyls, ethers, ketones, aldehydes, amine, amides, imines, thiols and the like. Preferred chelating organic acids are polycarboxylic acids and hydroxy-substituted carboxylic acids. The term "hydroxy-substituted carboxylic acids" includes hydroxy-substituted polycarboxylic acids. Suitable organic acids include, but are not limited to: oxalic acid, malonic acid, methylmalonic acid, dimethylmalonic acid, maleic acid, malic acid, citramalic acid, tartaric acid, phthalic acid, citric acid, glutaric acid, glycolic acid, lactic acid, pyruvic acid, oxalacetic acid, ketoglutaric acid, salicylic acid and acetoacetic acid. Preferred organic acids are oxalic acid, malonic acid, dimethylmalonic acid, citric acid and lactic acid, and more preferably malonic acid. Mixtures of organic acids may be advantageously used in the present invention. Those skilled in the art will realize that polycarboxylic acids have a pKa value for each carboxylic acid moiety in the compound. Only one of the pKa values in such polycarboxylic acids needs to be within the range of 1 to 4 at 25° C. for the organic acid to be suitable for use in the present invention. Such stabilizing agents are typically used in an amount of 1 to 10,000 ppm and preferably from 10 to 1000 ppm. Such stabilizing agents function to retard further condensation of the material and extend the shelf-life of the partial condensates.

Preferred solvent materials to formulate and cast an overcoating composition are any which dissolve or disperse the component(s) of the curable layer composition (e.g., one or more resins) but do not appreciably dissolve an underlying photoresist layer. More particularly, suitable solvents to formulate a curable composition include one or more of, but are not limited to, alcohols such as isopropanol, n-butanol, alkylene glycols, such as propylene glycol. Alternatively non-polar solvents such as aliphatic and aromatic hydrocarbons such as dodecane, isooctane, mesitylene and xylenes may be used.

An overcoating composition may be suitably preferred by admixture of one or more solid components (e.g. one or more resins) into one or more polar solvents such as those identified above or alternatively one or more non-polar solvents such as the aliphatic and aromatic hydrocarbons identified above.

Additional suitable optional components of a curable compositions include quencher bases (e.g. such as those discussed above for use with photoresists) and photoacid generator compounds (e.g. such as those discussed above for use with photoresists.

Processing

As discussed above, a photoresist composition is applied as a coating layer to a substrate by any of a variety of methods such as spin coating. The resist in general is applied on a substrate with a dried layer thickness of between about 0.02 and 3 µm. The substrate is suitably any substrate used in processes involving photoresists. For example, the substrate can be silicon, silicon dioxide or aluminum-aluminum oxide microelectronic wafers. Gallium arsenide, silicon carbide, ceramic, quartz or copper substrates may also be employed. Substrates for liquid crystal display or other flat panel display applications are also suitably employed, for example glass substrates, indium tin oxide coated substrates and the like. Substrates for optical and optical-electronic devices (e.g. waveguides) also can be employed. Following application, the photoresist coating layer is typically dried by heating to remove solvent preferably until the resist layer is tack free.

The resist layer is then imaged with activating radiation through a mask in a conventional manner. The exposure energy is sufficient to effectively activate the photoactive component of the resist system to produce a patterned image in the resist coating layer. Typically, the exposure energy ranges from about 3 to 300 mJ/cm$^2$ and depending in part upon the exposure tool and the particular resist and resist processing that is employed. The exposed resist layer may be subjected to a post-exposure bake if desired to create or enhance solubility differences between exposed and unexposed regions of a coating layer. For example, negative acid-hardening photoresists typically require post-exposure heating to induce the acid-promoted crosslinking reaction, and many chemically amplified positive-acting resists require post-exposure heating to induce an acid-promoted deprotection reaction. Typically post-exposure bake conditions include temperatures of about 50° C. or greater, more specifically a temperature in the range of from about 50° C. to about 160° C.

The exposed resist coating layer is then developed, preferably with an aqueous based developer such as an alkali exemplified by tetra butyl ammonium hydroxide, sodium hydroxide, potassium hydroxide, sodium carbonate, sodium bicarbonate, sodium silicate, sodium metasilicate, aqueous ammonia or the like. Alternatively, organic developers can be used. In general, development is in accordance with art recognized procedures.

The curable composition then may be applied over (overcoated) the photoresist layer. The curable composition then may be treated thermally (e.g. in excess of 100° C., 110° C., 120° C., 130° C., 140° C. or 150° C. for 60 to 120 seconds) and/or with activating radiation (e.g. flood exposure with 248 nm or 193 nm radiation) to harden curable composition areas that encase the photoresist relief image. Acid from the photoresist relief image can migrate into those adjacent curable composition areas to facilitate such hardening. Non-cured areas of the curable composition then can be removed such as with a plasma etchant or treatment with a developer composition e.g. an aqueous alkaline developer.

The developed substrate may then be selectively processed on those substrate areas bared of photoresist, for example, chemically etching or plating substrate areas bared of photoresist in accordance with procedures well known in the art. Suitable etchants include a hydrofluoric acid etching solution and a plasma gas etch such as an oxygen plasma etch.

The following non-limiting examples are illustrative of the invention.

EXAMPLE 1

Particle Additive Preparation

A preferred fluorinated particle additive is prepared as follows:

A reactor vessel is charged with a desired amount of propylene glycol monomethyl ether acetate (PGMEA) and heated to 80° C. with N$_2$ purge. The following monomers (PFPA, ECPMA, TMPTA), cross-linker and initiator (t-amyl peroxypivalate) are mixed in PGMEA at 80 to 90 weight % fluid composition in an ice bath. The initiator content is 4% relative to the total amount of monomers and cross-liker. The monomers were used in the following weight amounts: 70 weight % pentafluoracrylate (PFPA), 20 weight % ethyl cyclopentyl methacrylate (ECPMA), and 10 weight % TMPTA:

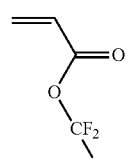

PFPA

-continued

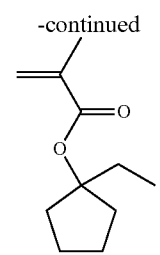

ECPMA

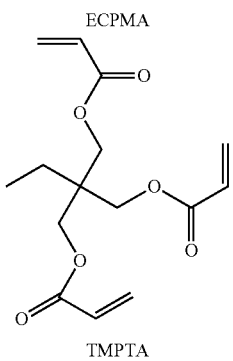

TMPTA

That monomer/crosslinker/initiator/PGMEA mixture is then fed into the reactor vessel at a rate of approximately 1 ml/min. After the addition to the reactor vessel is complete, the temperature of mixture within the reactor vessel is held at 80° C. for 30 minutes. Then, an additional 2 weight % (relative to the total monomers and cross-liner) of initiator is fed into the reactor. After that addition, the temperature of the mixture within the reactor vessel is held at 80° C. for additional 2 hours. Thereafter, the temperature of the reactor vessel is permitted to cool to room temperature.

By that procedure, polymer particles were provided that had a number-average molecular weight (Mn) of 7088 and a weight-average molecular weight (Mw) of 19255.

EXAMPLE 2

Photoresist Preparation

A photoresist composition is prepared by admixing the following materials in the specified amounts:
1. Resin component: Terpolymer of (2-methyl-2-adamantyl methacrylate/beta-hydroxy-gamma-butyrolactone methacrylate/cyano-norbornyl methacrylate in an amount of 6.79 weight % based on total weight of the photoresist composition;
2. Photoacid generator compound: T-butyl phenyl tetramethylene sulfonium perfluorobutanesulfonate in an amount of 0.284 weight % based on total weight of the photoresist composition;
3. Base additive: N-Alkyl Caprolactam in an amount of 0.017 weight % based on total weight of the photoresist composition;
4. Surfactant: R08 (fluorine-containing surfactant, available from Dainippon Ink & Chemicals, Inc.) in an amount of 0.0071 weight % based on total weight of the photoresist composition
5. Substantially non-mixable additive: fluorinated PFPA/ECPMA/TMPTA terpolymer particle having Mn of 7088 and Mw of 19255 prepared as described in Example 1 above and in an amount of 0.213 weight % based on total weight of the photoresist composition.
6. Solvent component: propylene glycol monomethyl ether acetate to provide about a 90 percent fluid composition.

EXAMPLE 3

Curable (Overcoating) Composition Preparation

A curable composition is prepared by admixing the following materials in the specified amounts:
1. Resin component: polymerization formed by copolymerization of methacrylic acid and 3-methacryloxypropyltrimethoxysiolane;
2. Separate Crosslinker: tetramethoxyglycouril;
3. Solvent component: isobutanol to provide about a 90 percent fluid composition.

EXAMPLE 4

Processing

A photoresist of Example 2 is spin-coated onto a 8 inch silicon wafer that has an organic antireflective coating composition thereon. The applied photoresist coating layer is soft baked at 90° C. for 60 seconds. The dried resist layer is exposed to 193 nm radiation through a photomask. Wafers are then subjected to a post-exposure bake at 90° C. for 90 seconds and subsequently developed in a 0.26 N aqueous alkaline developer using a 45 second single puddle process to provide a photoresist relief image.

A curable composition of Example 3 is then spin coated over the photoresist relief image and baked at 110° C. for 90 seconds to remove the casting solvent and harden the composition in areas adjacent to the resist image. The coated wafer is then developed with 0.26 N aqueous alkaline developer. The sacrificial photoresist relief image is then remove with treatment with an oxygen plasma etch. The curable composition relief image remains in increased pitch relative to the removed photoresist relief image.

What is claimed is:

1. A method for fabricating an electronic device, comprising:
   (a) providing a chemically-amplified positive-acting photoresist relief image on a substrate;
   (b) applying a curable composition over the photoresist relief image to provide a composite of the photoresist and curable composition, wherein the curable composition comprises a silicon-containing component;
   (c) treating the composite to provide relief image of photoresist encased by curable composition;
   (d) exposing the composite to activating radiation to permit hardening of the curable composition and then development to remove the photoresist, wherein the curable composition crosslinks in presence of acid that migrates from the photoresist,
   wherein following removing the photoresist, the curable composition remains in a relief image of decreased pitch relative to the photoresist.

2. The method of claim 1 wherein a single exposure step is utilized.

3. The method of claim 1 wherein the composite is substantially free of the curable composition on the top surface of the imageable material.

4. The method of claim 1 wherein the photoresist and curable composition each contains one or more organic components and are applied by spin coating.

5. The method of claim 1 wherein the curable composition is cured after applying and prior to treating to provide a relief image.

6. A method for fabricating an electronic device, comprising:
   (a) applying a chemically-amplified positive-acting photoresist on a substrate surface;
   (b) exposing the photoresist to patterned activating radiation and developing the exposed material to provide a positive photoresist relief image;
   (c) applying a curable organic composition over the positive relief image to provide a composite of the photoresist and curable composition, and wherein the curable organic composition comprises a silicon-containing component;
   (d) curing the curable organic composition of the composite whereby the organic composition crosslinks in the presence of acid that crosslinks in the presence of acid that migrates from the photoresist;
   (e) treating the composite to provide a relief image of photoresist encased by the curable composition;
   (f) exposing the composite to activating radiation to permit hardening of the curable organic composition and then development to remove the photoresist,
   wherein following removing the photoresist, the curable organic composition remains in a relief image of decreased pitch relative to the previously developed photoresist.

7. The method of claim 6 wherein the curable composition is cured by flood exposure with activating radiation.

8. The method of claim 6 wherein the curable composition is cured by thermal treatment.

* * * * *